United States Patent
Hsieh et al.

(10) Patent No.: US 11,081,523 B1
(45) Date of Patent: Aug. 3, 2021

(54) MEMORY DEVICES AND METHODS OF FORMING MEMORY DEVICES

(71) Applicant: GLOBALFOUNDRIES Singapore Pte. Ltd., Singapore (SG)

(72) Inventors: Curtis Chun-I Hsieh, Singapore (SG); Wei-Hui Hsu, Singapore (SG); Yi Jiang, Singapore (SG); Wanbing Yi, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/931,623

(22) Filed: May 14, 2020

(51) Int. Cl.
   *H01L 27/24*      (2006.01)
   *G11C 13/00*      (2006.01)
   *H01L 45/00*      (2006.01)

(52) U.S. Cl.
   CPC ...... *H01L 27/2472* (2013.01); *H01L 45/1253* (2013.01); *H01L 45/16* (2013.01); *G11C 13/0002* (2013.01); *G11C 13/0004* (2013.01)

(58) Field of Classification Search
   None
   See application file for complete search history.

(56) References Cited

U.S. PATENT DOCUMENTS

| | | | | |
|---|---|---|---|---|
| 8,519,371 B2* | 8/2013 | Fukumizu | ........... | H01L 45/1233 257/2 |
| 10,439,134 B2 | 10/2019 | Majhi et al. | | |
| 2007/0025226 A1* | 2/2007 | Park | .............. | H01L 45/143 369/100 |
| 2012/0080771 A1* | 4/2012 | Yang | .............. | H01L 25/0657 257/532 |
| 2013/0056850 A1* | 3/2013 | Kume | .............. | H01L 28/90 257/532 |
| 2016/0126347 A1* | 5/2016 | Wada | .............. | H01L 29/1608 |

* cited by examiner

*Primary Examiner* — Tan T. Nguyen
(74) *Attorney, Agent, or Firm* — Viering Jentschura & Partner MBB

(57) ABSTRACT

A memory device may be provided, including a base layer, an insulating layer, a first electrode, a switching element, a capping element and a second electrode. The insulating layer may be arranged over the base layer and may include a recess having opposing side walls. The first electrode may be arranged at least partially within the recess of the insulating layer and along the opposing side walls of the recess of the insulating layer. The switching element may be arranged at least partially within the recess of the insulating layer and along the first electrode. The capping element and the second electrode may be arranged at least partially within the recess of the insulating layer. The capping element may be arranged between the second electrode and the switching element, and a part of the second electrode may extend across the capping element to contact the switching element.

20 Claims, 14 Drawing Sheets

MEMORY DEVICES AND METHODS OF FORMING MEMORY DEVICES

TECHNICAL FIELD

The present disclosure relates generally to memory devices, and methods of forming the memory devices.

BACKGROUND

Non-volatile memory devices are often used in consumer electronic products such as smart phones and tablets. One type of non-volatile memory device is the resistive random access memory device (RRAM). A RRAM typically uses a switching element such as a dielectric element sandwiched between two electrodes. The switching element is normally insulating. However, upon application of a sufficiently high potential difference (set voltage/switching voltage) between the electrodes, a dielectric breakdown event can occur and conducting filaments may be formed within the switching element. The switching element thus becomes conductive via the conducting filaments. The switching element can be made insulating again by applying a sufficiently low voltage difference (reset voltage) to the electrodes to break the conducting filaments. A typical RRAM can switch between states based on the resistance of the switching element. When the switching element is insulating, the switching element has a high resistance, and the RRAM may be referred to as being in a high resistance state (HRS). When the switching element is conductive, the switching element has a low resistance and the RRAM may be referred to as being in a low resistance state (LRS). To set the RRAM, the RRAM is switched from the HRS to the LRS. To reset the RRAM, the RRAM is switched from the LRS to the HRS.

A RRAM (and therefore, its switching element) is generally large in size. Further, conducting filaments are often formed at random across many locations within the switching element. This may be due to process variations during the fabrication of the RRAM. These can cause the resistance of the RRAM to vary greatly across multiple dielectric breakdown events. For example, the resistance of the switching element when the RRAM is in the FIRS tends to vary greatly over different cycles. This can lead to high device-to-device variability and cycle-to-cycle variability.

Accordingly, it is desirable to provide an improved memory device having reduced variability in its resistance.

SUMMARY

According to various non-limiting embodiments, there may be provided a memory device including: a base layer; an insulating layer arranged over the base layer, wherein the insulating layer may include a recess having opposing side walls; a first electrode arranged at least partially within the recess of the insulating layer and along the opposing side walls of the recess of the insulating layer; a switching element arranged at least partially within the recess of the insulating layer and along the first electrode; a capping element arranged at least partially within the recess of the insulating layer; and a second electrode arranged at least partially within the recess of the insulating layer, wherein the capping element may be arranged between the second electrode and the switching element, and a part of the second electrode may extend across the capping element to contact the switching element.

According to various non-limiting embodiments, there may be provided a method including: providing a base layer; forming an insulating layer over the base layer, wherein the insulating layer may include a recess having opposing side walls; forming a first electrode at least partially within the recess of the insulating layer and along the opposing side walls of the recess of the insulating layer; forming a switching element at least partially within the recess of the insulating layer and along the first electrode; forming a capping element at least partially within the recess of the insulating layer; and forming a second electrode at least partially within the recess of the insulating layer, wherein the capping element may be arranged between the second electrode and the switching element, and a part of the second electrode may extend across the capping element to contact the switching element.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1:
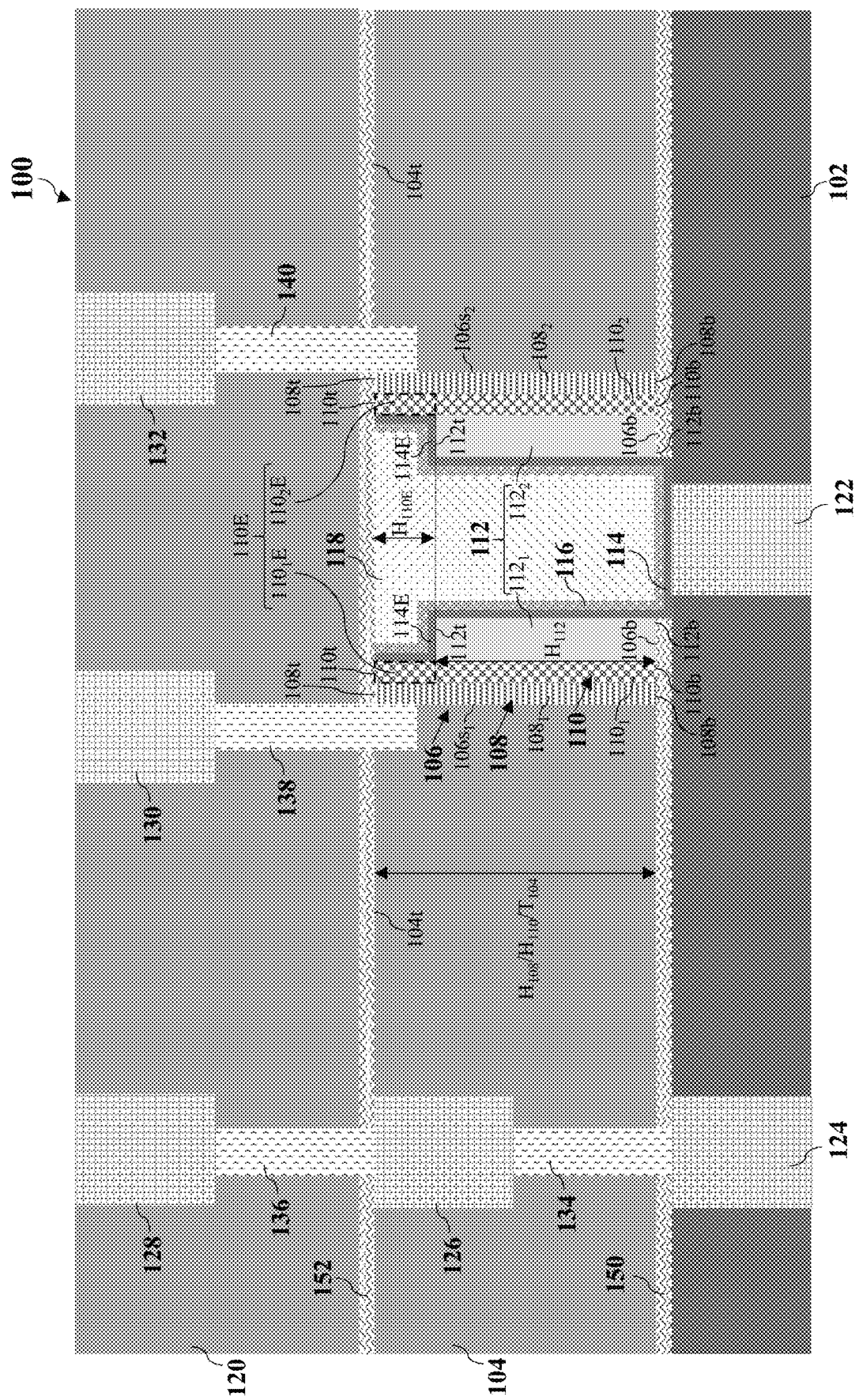
FIG. 1 shows a simplified cross-sectional view of a memory device according to various non-limiting embodiments.

The embodiments generally relate to semiconductor devices. More particularly, some embodiments relate to memory devices, for instance, non-volatile memory devices such as RRAM devices in a non-limiting example. The memory devices may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a memory device 100 according to various non-limiting embodiments. The memory device 100 may include a RRAM device.

As shown in FIG. 1, the memory device 100 may include a base layer 102. The base layer 102 may be an inter-layer dielectric (ILD) layer and may include insulating material, such as, but not limited to, silicon oxide, silicon dioxide, silicon nitride, or combinations thereof.

The memory device 100 may further include an insulating layer 104 arranged over the base layer 102. The insulating layer 104 may also be an inter-layer dielectric (ILD) layer and may include insulating material, such as, but not limited to, silicon oxide, silicon dioxide, silicon nitride or combinations thereof. As shown in FIG. 1, the insulating layer 104 may include a top surface 104t and a recess 106. The recess 106 may have a bottom surface 106b and opposing side walls (including a first side wall $106s_1$ and a second side wall $106s_2$). The side walls $106s1$, $106s2$ may be vertical (in other words, may extend substantially perpendicular to the bottom surface 106b of the recess 106) or may alternatively be slanted at an angle relative to the bottom surface 106b of the recess 106.

A first blocking layer 150 may be arranged between the insulating layer 104 and the base layer 102. The first blocking layer 150 may include blocking material, such as, but not limited to, Nblok (nitrogen-doped silicon carbide).

The memory device 100 may also include a first electrode 108 arranged at least partially within the recess 106 of the insulating layer 104. In FIG. 1, the first electrode 108 is depicted as being arranged completely within the recess 106. However, alternatively, a part of the first electrode 108 may be arranged external of the recess 106. The first electrode 108 may include a base surface 108b arranged along the bottom surface 106b of the recess 106 and a top surface 108t laterally aligned with the top surface 104t of the insulating layer 104. Further, the first electrode 108 may be arranged along the opposing side walls $106s_1$, $106s_2$ of the recess 106. In particular, the first electrode 108 may include a first part $108_1$ arranged along the first side wall $106s_1$ and a second part $108_2$ arranged along the second side wall $106s_2$. The first and second parts $108_1$, $108_2$ of the first electrode 108 may be separated from each other. Accordingly, the base surface 108b and the top surface 108t of the first electrode 108 may each include a gap. The first electrode 108 may be an inert electrode and may include inert electrode material, such as, but not limited to, ruthenium (Ru), platinum (Pt), titanium nitride (TiN), tantalum nitride (TaN), alloys thereof, or combinations thereof.

The memory device 100 may further include a switching element 110 arranged at least partially within the recess 106 of the insulating layer 104 and along the first electrode 108. In FIG. 1, the switching element 110 is depicted as being arranged completely within the recess 106. Alternatively, a part of the switching element 110 may be arranged external of the recess 106. The switching element 110 may include a base surface 110b arranged along the bottom surface 106b of the recess 106 and a top surface 110t laterally aligned with the top surface 104t of the insulating layer 104. As shown in FIG. 1, the switching element 110 may include a first part $110_1$ nearer to the first side wall $106s_1$ of the recess 106 and a second part $110_2$ nearer to the second side wall $106s_2$ of the recess 106. The first part $110_1$ of the switching element 110 may be arranged along the first part $108_1$ of the first electrode 108 and the second part $110_2$ of the switching element 110 may be arranged along the second part $108_2$ of the second electrode 108. The first and second parts $110_1$, $110_2$ of the switching element 110 may similarly be separated from each other. Accordingly, the base surface 110b and the top surface 110t of the switching element 110 may each include a gap. The switching element 110 may include switching material, such as, but not limited to, magnesium oxide (MgO), tantalum oxide ($TaO_2$), hafnium oxide ($HfO_2$), titanium oxide ($TiO_2$), aluminum oxide ($AlO_2$), silicon dioxide ($SiO_2$), or combinations thereof.

The memory device 100 may further include a capping element 112 arranged at least partially within the recess 106 of the insulating layer 104. The capping element 112 may also be referred to as a sidewall capping layer. In particular, as shown in FIG. 1, the capping element 112 may be arranged completely within the recess 106 of the insulating layer 104 (although, alternatively, a part of the capping element 112 may be arranged external of the recess 106). The capping element 112 may include a base surface 112b arranged along the bottom surface 106b of the recess 106 and a top surface 112t. As shown in FIG. 1, the base surfaces 108b, 110b, 112b of the first electrode 108, the switching element 110 and the capping element 112 may be laterally aligned. Although the top surface 112t is depicted as a flat surface in FIG. 1, the top surface 112t may be curved or sloped due to processes (e.g. etching processes) during the fabrication of the memory device 100.

The capping element 112 may be arranged along the switching element 110. Referring to FIG. 1, the capping element 112 may include a first segment $112_1$ nearer to the first side wall $106s_1$ of the recess 106, and a second segment $112_2$ nearer to the second side wall $106_2$ of the recess 106. The first segment $112_1$ of the capping element 112 may be arranged along the first part $110_1$ of the switching element 110 and the second segment $112_2$ of the capping element 112 may be arranged along the second part $110_2$ of the switching element 110. The first and second segments $112_1$, $112_2$ of the capping element 112 may be separated from each other, with each of these segments $112_1$, $112_2$ being a continuous segment. Accordingly, the base surface 112b and the top surface 112t of the capping element 112 may each include a gap.

As shown in FIG. 1, a height $H_{108}$ of the first electrode 108, a height $H_{110}$ of the switching element 110 and a thickness $T_{104}$ of the insulating layer 104 may be approximately equal at a micron (um) level. However, the heights may differ on a nanometer (nm) level as a result of material selectivity during processing of the structure. The difference in heights can be up to 20 nm. Further, a height $H_{112}$ of the capping element 112 may be smaller than the height $H_{110}$ of the switching element 110. For example, a height $H_{108}$ of the first electrode 108 may range from about 100 nm to about 400 nm, a height $H_{110}$ of the switching element 110 may range from about 100 nm to about 400 nm, and a height $H_{112}$ of the capping element 112 may range from about 60 nm to about 240 nm. Accordingly, the capping element 112 may be arranged along only a part of the switching element 110. The switching element 110 may thus include a covered region adjoining the capping element 112 and an exposed region 110E (including separate portions $110_1E$, $110_2E$) extending beyond the top surface 112t of the capping element 112. A height $H_{110E}$ of the exposed region 110E (or in other words, of each portion $110_1E$, $110_2E$) may be greater than or equal to 10 nm, and in some non-limiting embodiments, may range from about 40 nm to about 160 nm.

The capping element 112 may include capping material with a high etch selectivity with respect to the switching element 110. For instance, the capping element 112 may include capping material with an etch selectivity of greater than 5 with respect to the switching element 110. For example, the capping element 112 may include Nblok (nitrogen-doped silicon carbide), silicon nitride (SiN), chemical vapor deposition (CVD) carbon, or combinations thereof.

The memory device 100 may further include a second electrode 114 arranged at least partially within the recess 106 of the insulating layer 104. The second electrode 114 may include active electrode material such as, but not limited to, tantalum (Ta), tantalum nitride (TaN), hafnium (Hf), titanium (Ti), titanium nitride (TiN), platinum (Pt), copper (Cu), silver (Ag), cobalt (Co), tungsten (W), alloys thereof, or combinations thereof.

As shown in FIG. 1, the capping element 112 may be arranged between the second electrode 114 and the switching element 110, and the second electrode 114 may adjoin the exposed region 110E of the switching element 110. In particular, a part 114E of the second electrode 114 may extend over the capping element 112 to contact the switching element 110. Referring to FIG. 1, the second electrode 114 may include a liner arranged along the exposed region 110E of the switching element 110 and further along the capping element 112. The liner may also extend into and across the first blocking layer 150. The liner may be thin with its thickness ranging from about 5 nm to about 15 nm. This may help to reduce the amount of active electrode material used for fabricating the memory device 100, and hence, the cost of this fabrication.

The memory device 100 may further include a conductive layer 116 and a conductive region 118 arranged at least partially within the recess 106. As shown in FIG. 1, the conductive layer 116 may be arranged over and along an entire length of the second electrode 114, and the conductive region 118 may be arranged over the conductive layer 116 to fill the remaining portion of the recess 106. The conductive layer 116 and the conductive region 118 may each include conductive material such as, but not limited to, aluminum, copper, tungsten, tantalum, tantalum nitride, titanium, titanium nitride, cobalt, alloys thereof, or combinations thereof. For example, the conductive layer 116 may include tantalum, tantalum nitride or cobalt, and the conductive region 118 may include copper. Alternatively, the conductive layer 116 may include titanium or titanium nitride, and the conductive region 118 may include tungsten. In FIG. 1, the conductive layer 116 and the conductive region 118 are shown as including different materials, but in alternative non-limiting embodiments, the conductive layer 116 and the conductive region 118 may include a same material.

As shown in FIG. 1, the memory device 100 may also include a further insulating layer 120 arranged above the insulating layer 104, and a second blocking layer 152 between the insulating layer 104 and the further insulating layer 120. The further insulating layer 120 may be an inter-layer dielectric (ILD) layer and may include insulating material, such as, but not limited to, silicon oxide, silicon dioxide, silicon nitride, or combinations thereof. The further insulating layer 120, the insulating layer 104 and the base layer 102 may include a same material, but alternatively, at least two of these layers 102, 104, 120 may include different materials. The second blocking layer 152 may include a blocking material, such as, but not limited to, Nblok (nitrogen-doped silicon carbide).

The memory device 100 may also include a plurality of contacts including a first contact 122, a second contact 124, a third contact 126, a fourth contact 128, a fifth contact 130 and a sixth contact 132. The memory device 100 may also include a plurality of connectors including a first connector 134, a second connector 136, a third connector 138 and a fourth connector 140. As shown in FIG. 1, the first contact 122 and the second contact 124 may be arranged within the base layer 102 and may be electrically isolated from each other by part of the base layer 102. The first contact 122 may contact the second electrode 114; whereas, the second contact 124 may be electrically connected to the third contact 126 by the first connector 134. In particular, the third contact 126 may be arranged within the insulating layer 104 and the first connector 134 may extend from the third contact 126 to the second contact 124, through the insulating layer 104 and the first blocking layer 150. The third contact 126 may in turn be connected to the fourth contact 128 by the second connector 136, where the second connector 136 may extend between the third and fourth contacts 126, 128 through the further insulating layer 120 and the second blocking layer 152. In addition, as shown in FIG. 1, the fifth contact 130 may be electrically connected to the first part $108_1$ of the first electrode 108 by the third connector 138; whereas, the sixth contact 132 may be electrically connected to the second part 108$_2$ of the first electrode 108 by the fourth connector 140. The fifth and sixth contacts 130, 132 may be arranged within the further insulating layer 120 and the third and fourth connectors 138, 140 may extend through the further insulating layer 120 and the second blocking layer 152 into the insulating layer 104.

As mentioned above, a first blocking layer 150 may be arranged between the insulating layer 104 and the base layer 102, and a second blocking layer 152 may be arranged between the further insulating layer 120 and the insulating layer 104. The first blocking layer 150 may help to reduce the amount of diffusion of conductive material from the second contact 124 into the insulating layer 104; whereas, the second blocking layer 152 may help to reduce the amount of diffusion of conductive material from the third contact 126, the conductive layer 116 and the conductive region 118 into the further insulating layer 120. The first and second blocking layers 150, 152 may be optional. For example, the first blocking layer 150 may be omitted and the second electrode 114 may extend along the bottom surface 106$b$ of the recess 106.

FIGS. 2A to 2L show simplified cross-sectional views that illustrate a method for fabricating the memory device 100 according to various non-limiting embodiments. For simplicity, the dimensions $H_{110E}$, $H_{112}$, $H_{108}/H_{110}/T_{104}$, the exposed region 110E of the switching element 110 and the part 114E of the second electrode 114 are not labelled in FIGS. 2A to 2L.

Figure 2A:
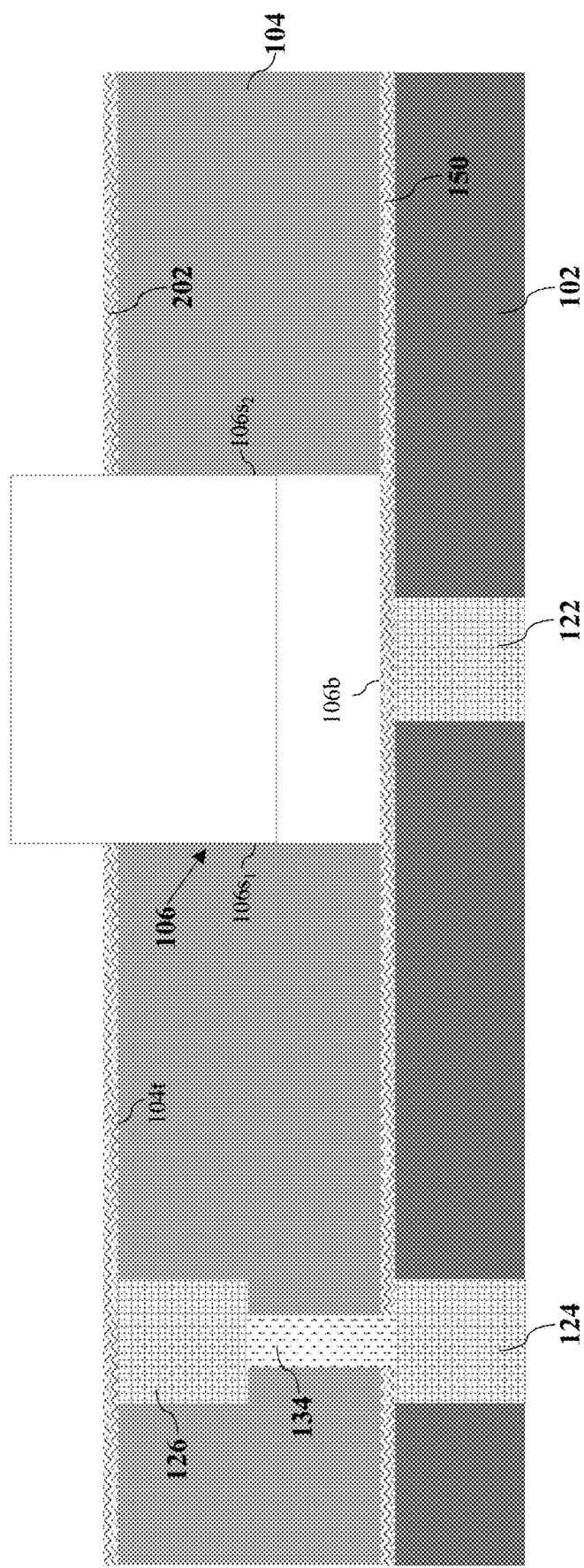
FIGS. 2A to 2L show simplified cross-sectional views that illustrate a method for fabricating the memory device of FIG. 1 according to various non-limiting embodiments.

Referring to FIG. 2A, the method may first include providing the base layer 102, and forming the first and second contacts 122, 124 within the base layer 102. For example, insulating material may first be deposited over a surface on which the memory device 100 is to be formed and then etched to form openings. The openings may subsequently be filled with conductive material to form the contacts 122, 124 within the base layer 102. As shown in FIG. 2A, the method may also include forming the first blocking layer 150 (by for example, depositing blocking material) over the base layer 102. Next, the insulating layer 104 may be formed over the first blocking layer 150, and the third contact 126 and first connector 134 may be formed within the insulating layer 104. For example, first insulating material may be deposited over the first blocking layer 150. The first insulating material and the first blocking layer 150 may be etched to form an opening, and conductive material may be deposited into this opening to form the first connector 134. Second insulating material may then be deposited over the first insulating material, and etched to form an opening. Conductive material may be deposited into this opening to form the third contact 126. Blocking material may then be deposited over the second insulating material to form an intermediate blocking layer 202. The intermediate blocking layer 202, first insulating material and second insulating material may then be etched in a single etching process to form the insulating layer 104 with the recess 106.

Figure 2B:
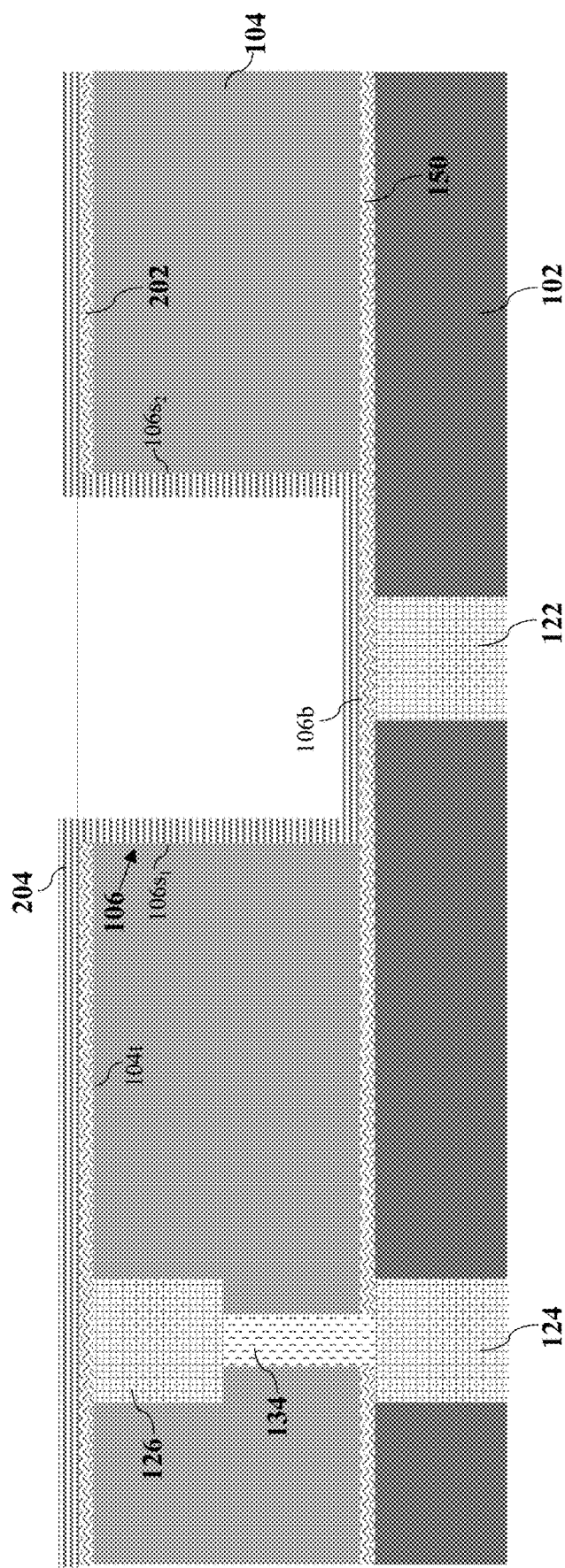
Figure 2C:
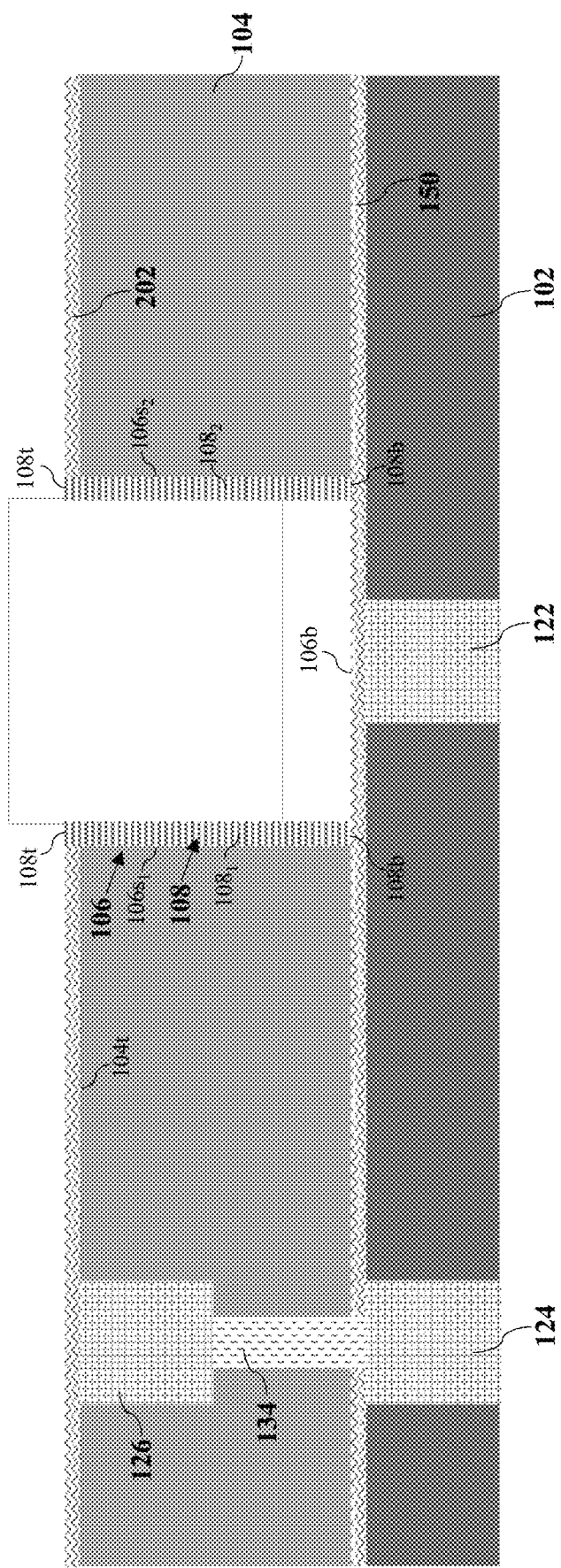

Referring to FIGS. 2B and 2C, the method may further include forming the first electrode 108. As shown in FIG. 2B, the method may include depositing electrode material 204 over the intermediate blocking layer 202 and into the recess 106, such that the electrode material 204 may line the side walls 106$s_1$, 106$s_2$ and the bottom surface 106$b$ of the recess 106. As shown in FIG. 2C, the electrode material 204 external of the recess 106 and a part of the electrode material 204 along the bottom surface 106$b$ of the recess 106 may then be removed (by for example, a spacer etch process). This may thus form the first and second parts 108$_1$, 108$_2$ of the first electrode 108.

Figure 2D:
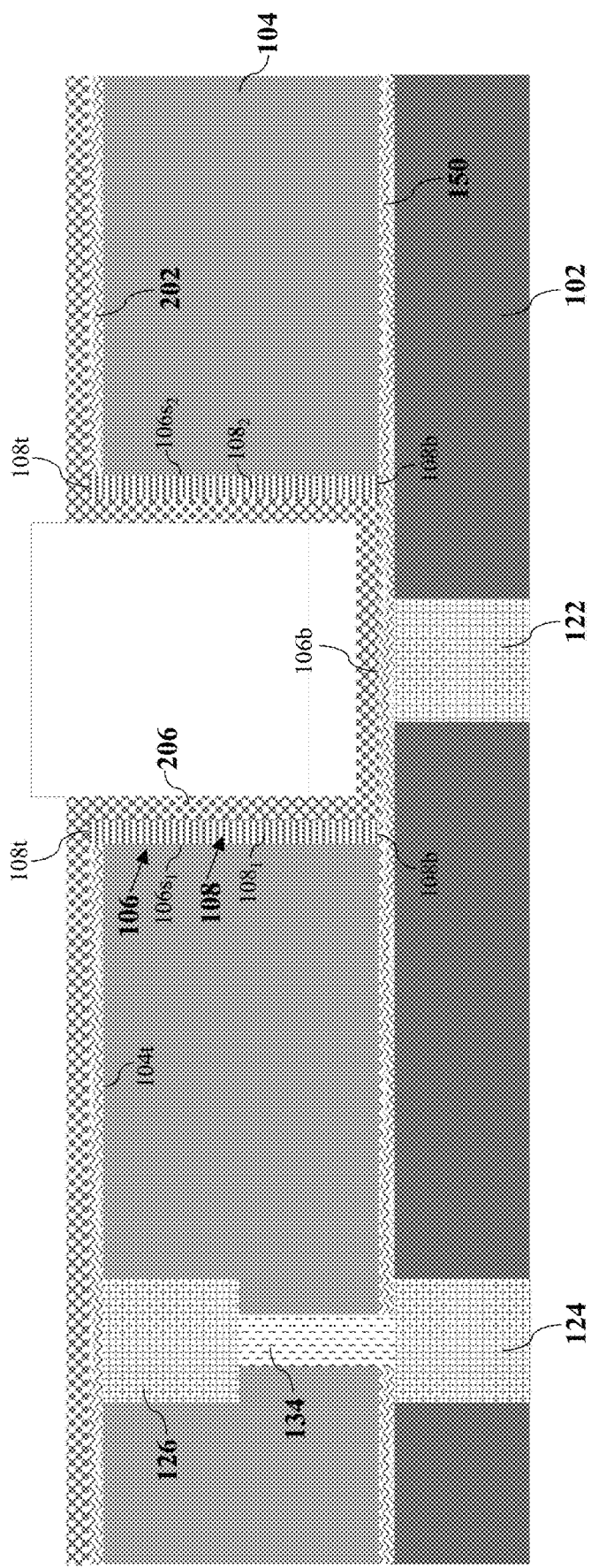
Figure 2E:
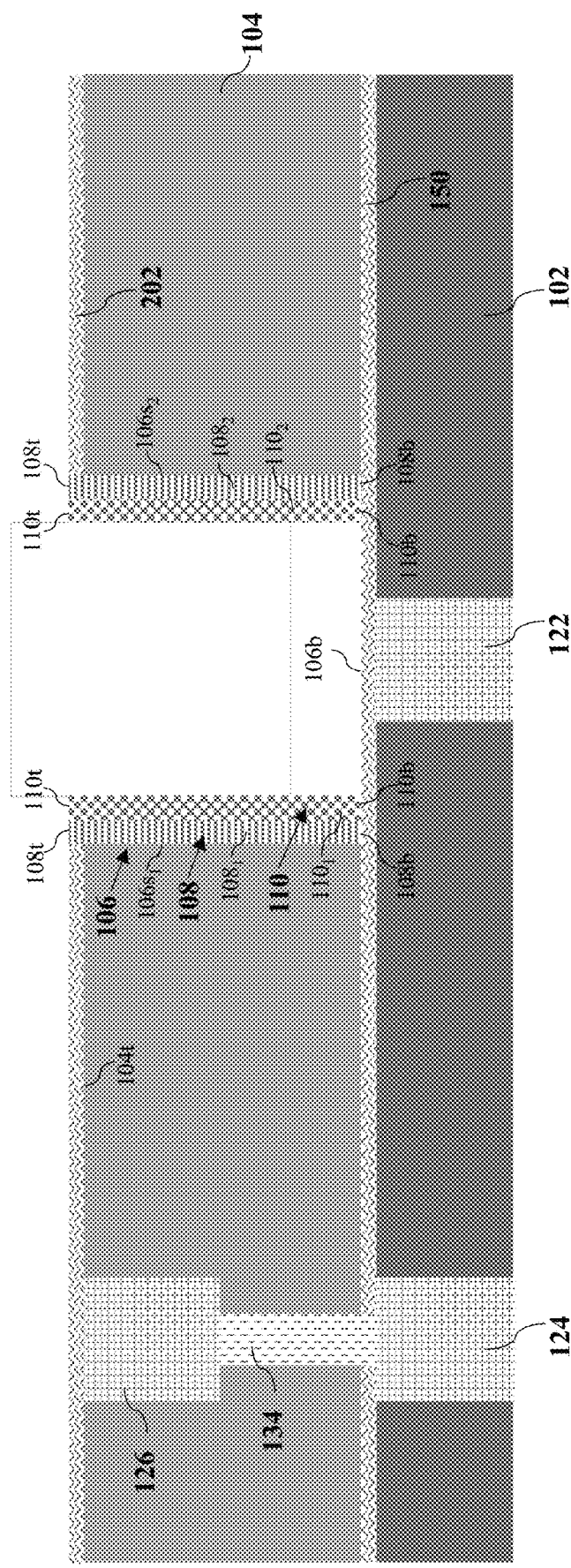

Referring to FIGS. 2D and 2E, the method may further include forming the switching element 110. As shown in FIG. 2D, the method may include depositing switching material 206 over the intermediate blocking layer 202 and into the recess 106, so that the switching material 206 may line the first electrode 108 and the bottom surface 106$b$ of the recess 106. As shown in FIG. 2E, the switching material 206 external of the recess 106 and a part of the switching material 206 along the bottom surface 106$b$ of the recess 106 may then be removed (by for example, a spacer etch process) to form the first and second parts 110$_1$, 110$_2$ of the switching element 110.

Figure 2F:
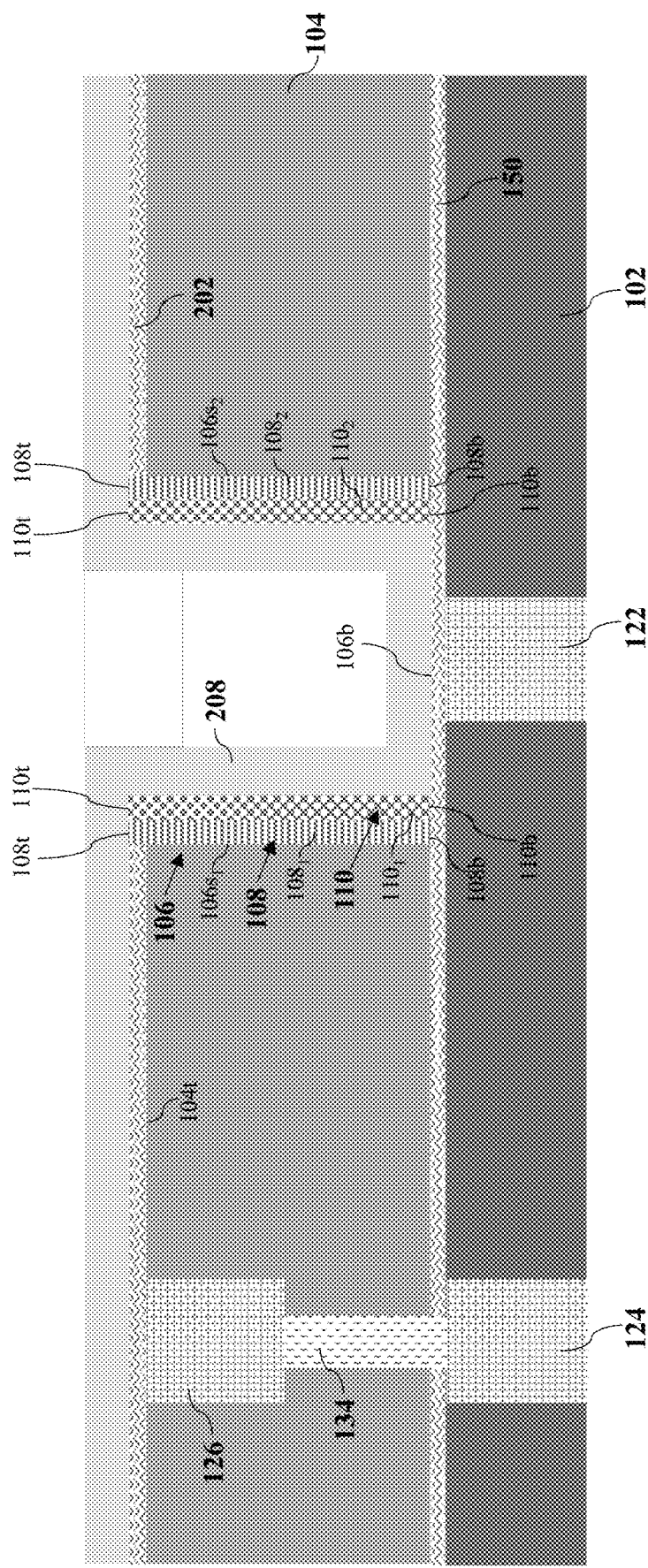
Figure 2G:
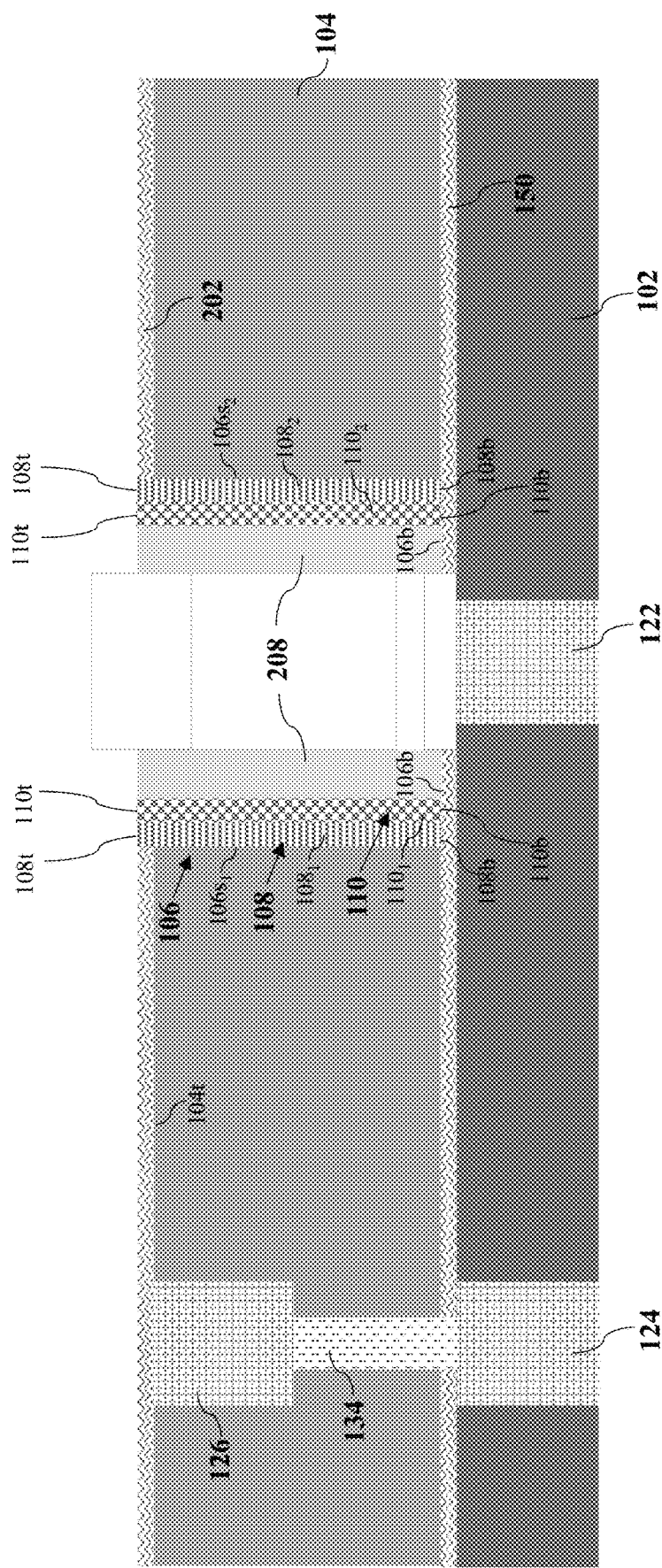
Figure 2H:
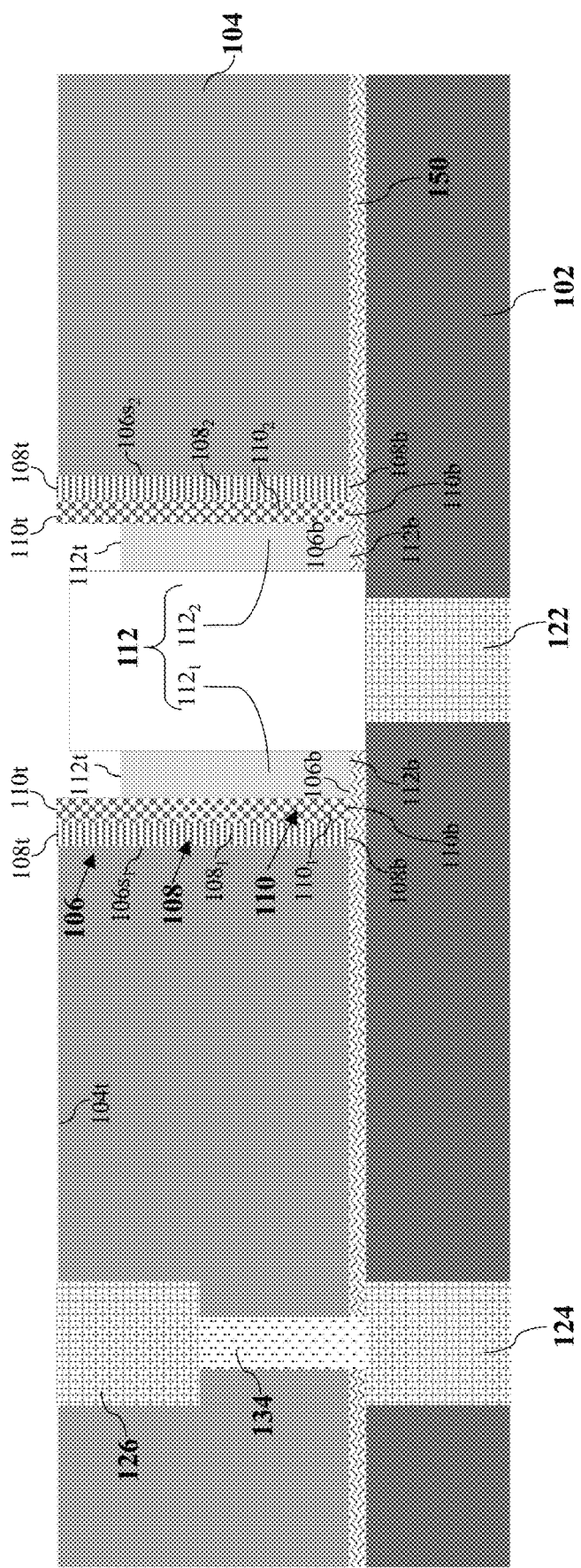

Referring to FIGS. 2F, 2G and 2H, the method may further include forming the capping element 112. As shown in FIG. 2F, forming the capping element 112 may include depositing capping material 208 over the intermediate blocking layer 202 and into the recess 106 of the insulating layer 104, so that the capping material 208 may line the switching element 110 and the bottom surface 106$b$ of the recess 106. As shown in FIG. 2G, the capping material 208 external of the recess 106 may then be removed. A part of the capping material 208 lining the bottom surface 106$b$ of the recess 106 may also be removed together with a part of the first blocking layer 150 thereunder (using for example, a single etching process). As shown in FIG. 2H, a part of the capping material 208 lining the switching element 110 may subsequently be removed to form the capping element 112 with the first and second segments 112$_1$, 112$_2$. This may be done by an over etch process or an etch-back process. As further shown in FIG. 2H, the method may also include removing the intermediate blocking layer 202.

Figure 2I:
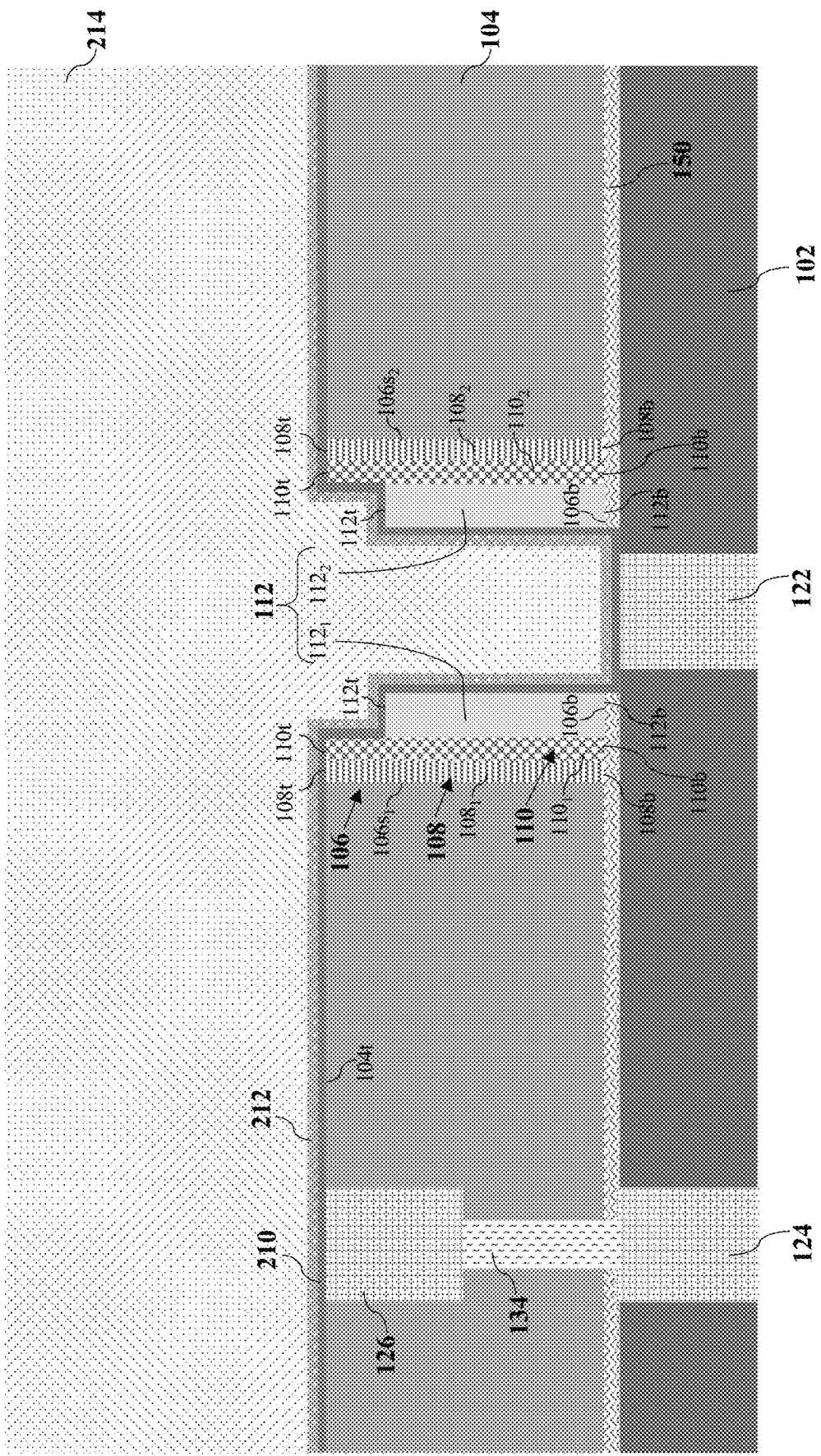
Figure 2J:
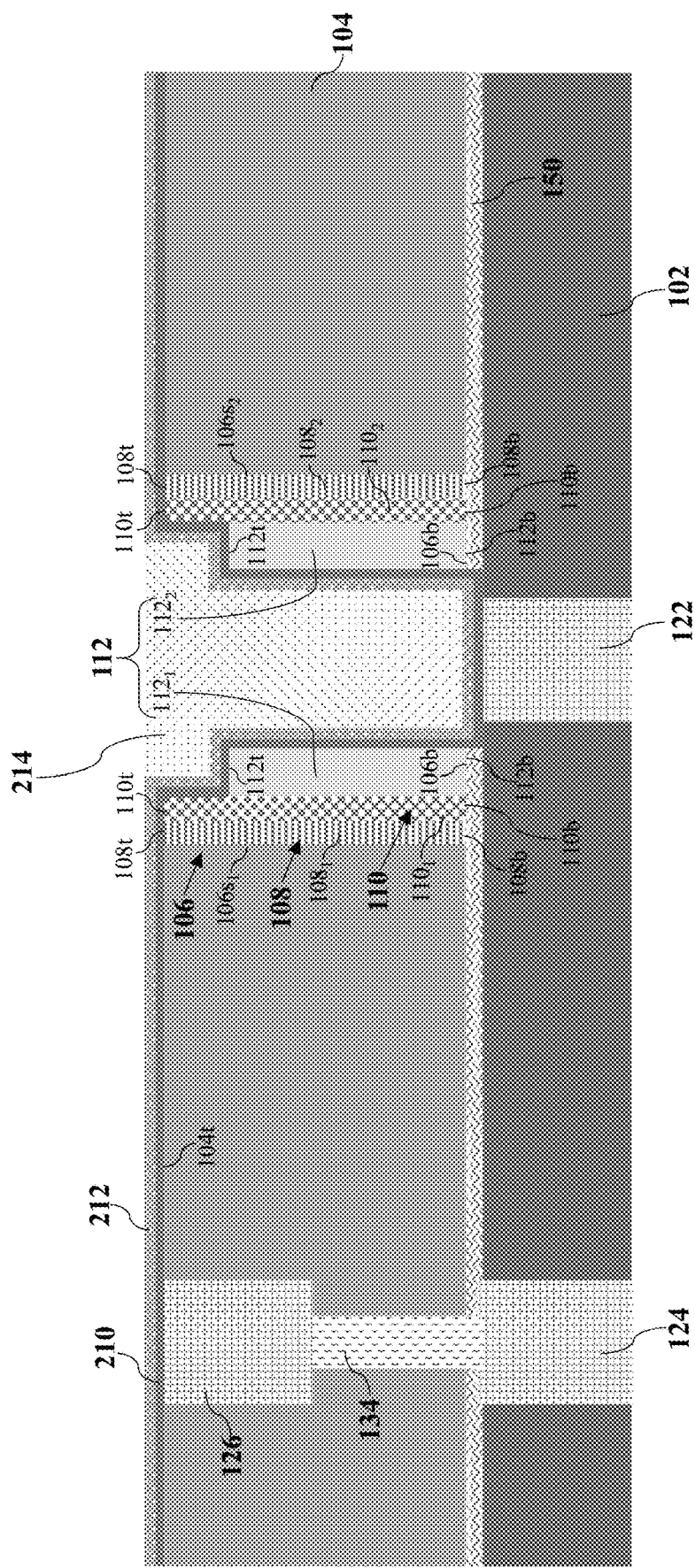
Figure 2K:
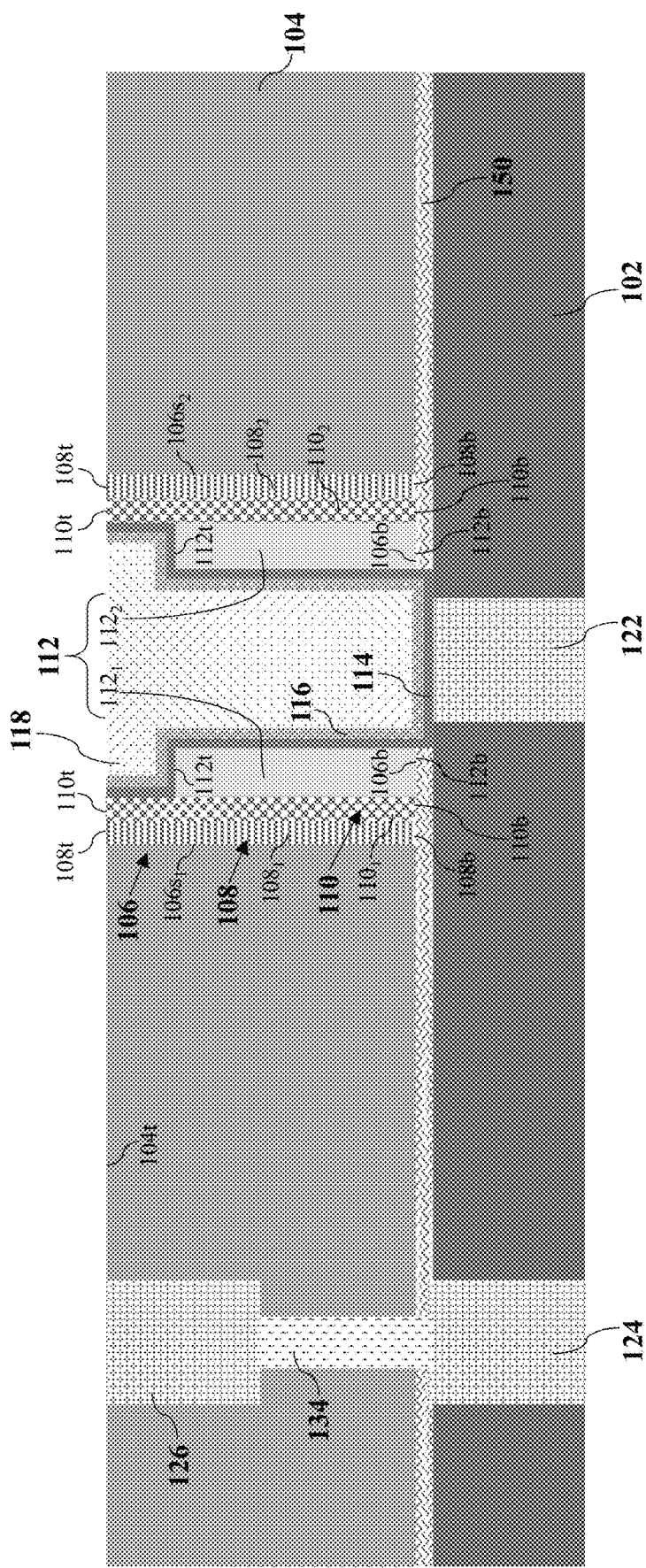

Referring to FIGS. 2I, 2J and 2K, the method may further include forming the second electrode 114, the conductive layer 116 and the conductive region 118. As shown in FIG. 2I, the method may include forming an active electrode liner 210 over the insulating layer 104, the first electrode 108, the switching element 110, the capping element 112 and the base layer 102. The method may further include forming an intermediate conductive layer 212 over the active electrode liner 210 and depositing conductive material 214 over the intermediate conductive layer 212. As shown in FIG. 2J, the method may further include removing a portion of the conductive material 214 over the intermediate conductive layer 212. This may be done by for example, a first chemical mechanical polishing (CMP) process. As shown in FIG. 2K, the method may then include removing a portion of the active electrode liner 210 and a portion of the intermediate conductive layer 212 external of the recess 106 to form the second electrode 114 and the conductive layer 116 respectively. A further portion of the conductive material 214 may also be removed to form the conductive region 118, so that a top surface of the conductive region 118 may be aligned with the top surface 104$t$ of the insulating layer 104. The portions of the active electrode liner 210, the intermediate conductive layer 212 and the conductive material 214 may be removed using a second CMP process.

Figure 2L:
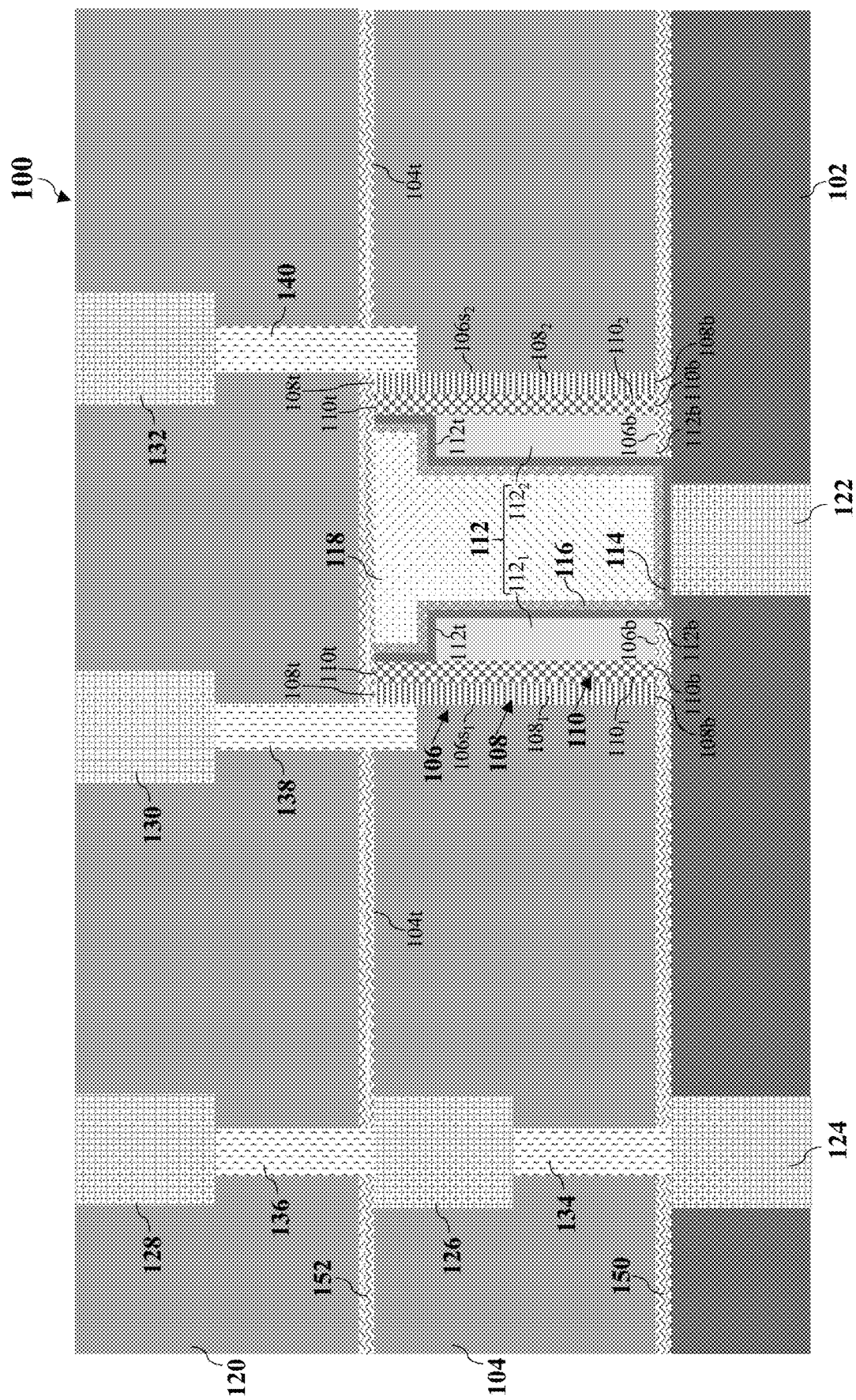

Referring to FIG. 2L, the method may further include forming the second blocking layer 152, the further insulating layer 120, the contacts 128, 130, 132 and the connectors 136, 138, 140. In particular, the method may include depositing blocking material over the first insulating layer 104 to form the second blocking layer 152. First insulating material may then be deposited over the second blocking layer 152. The first insulating material, the second blocking layer 152 and the insulating layer 104 may be etched to form openings, and the openings may then be filled with conductive material to form the connectors 136, 138, 140. Second insulating material may subsequently be deposited over the first insulating material and etched to form openings. These openings may be filled with conductive material to form the contacts 128, 130, 132. Together, the first and second insulating materials may form the further insulating layer 120.

The above described order for the method is only intended to be illustrative, and the method is not limited to the above specifically described order unless otherwise specifically stated.

In use, when a sufficiently high potential difference is applied between the first part $108_1$ of the first electrode 108 and the second electrode 114 (e.g. using the first and fifth contacts 122, 130), conducting filaments may be formed therebetween within the first part $110_1$ of the switching element 110. Similarly, when a sufficiently high potential difference is applied between the second part 1082 of the first electrode 108 and the second electrode 114 (e.g. using the first and sixth contacts 122, 132), conducting filaments may be formed therebetween within the second part $110_2$ of the switching element 110. Since the capping element 112 separates the second electrode 114 from the switching element 110, the conducting filaments may be confined within a smaller region of the switching element 110, in particular, within the portion $110_1E/110_2E$ of the exposed region 110E of the switching element 110 adjoining the second electrode 114.

The formation of the conducting filaments between the first part $108_1$ of the first electrode 108 and the second electrode 114 may be independent from the formation of the conducting filaments between the second part 1082 of the first electrode 108 and the second electrode 114. The memory device 100 may thus function as a two-bit memory device. Further, since the conducting filaments may be confined within a smaller region of the switching element 110, the stochasticity of the formation of the conducting filaments and the variability of the resistance of the memory device 100 may be reduced. In other words, greater uniformity in the performance of the memory device 100 may be achieved. The switching voltage of the memory device 100 may also be lower and thus, the power consumption may in turn be reduced.

In addition, as described above, the first electrode 108, the switching element 110 and the capping element 112 may extend substantially parallel to each other and to the opposing side walls $106s_1$, $106s_2$ of the recess 106. With this arrangement, the etching of the capping material to form the capping element 112 may result in less damage to the surface of the switching element 110 adjoining the second electrode 114. Further, the capping element 112 may be more easily formed and the dimensions of the exposed region 110E of the switching element 110 may be less dependent on lithography limitations.

As mentioned above, in the memory device 100, the part 114E of the second electrode 114 may extend over the capping element 112 to contact the switching element 110. However, in alternative non-limiting embodiments, the part 114E of the second electrode 114 may extend across the capping element 112 to contact the switching element 110 in other ways.

Figure 3:
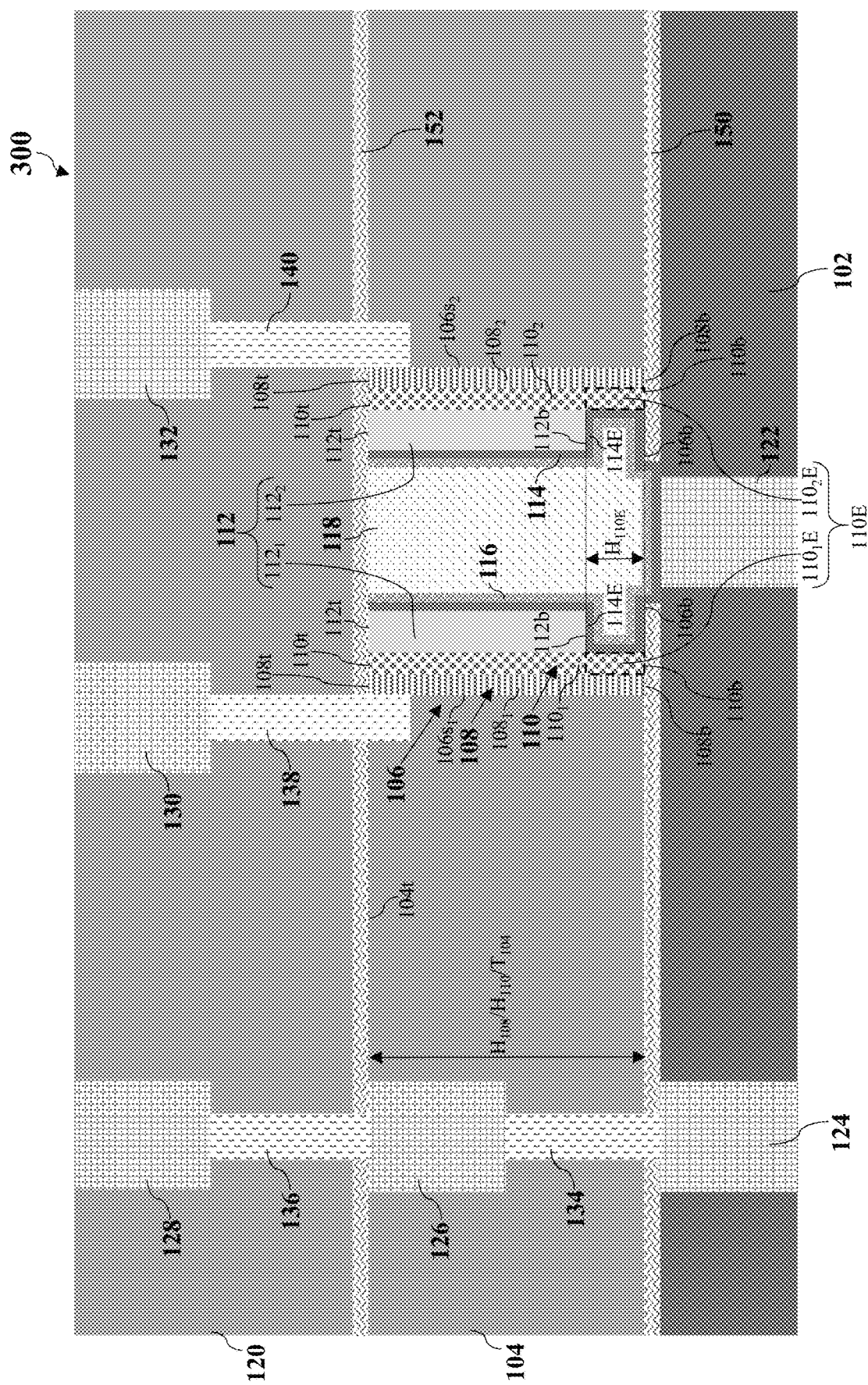
FIG. 3 shows a simplified cross-sectional view of a memory device according to alternative non-limiting embodiments.

FIG. 3 shows a memory device 300 according to alternative non-limiting embodiments. The memory device 300 is similar to the memory device 100, and thus, the common features are labelled with the same reference numerals and need not be discussed.

Referring to FIG. 3, the capping element 112 may similarly include a first segment $112_1$ and a second segment $112_2$, each of which may be a continuous segment. However, as compared to the memory device 100, the base surface 112b of the capping element 112 may not be laterally aligned with the base surfaces 108b, 110b of the first electrode 108 and the switching element 110. Instead, the top surfaces 112t, 108t, 110t of the capping element 112, the first electrode 108 and the switching element 110 may be laterally aligned. As mentioned above, the top surface 112t of the capping element 112 may be curved or sloped. In such non-limiting embodiments, by "the surfaces 108t, 110t, 112t being laterally aligned", it is meant that the top surfaces 108t, 110t of the first electrode 108 and the switching element 110 may be laterally aligned with a highest point of the top surface 112t, with a lowest point of this top surface 112t or with any point between the highest and lowest points of this top surface 112t. A part 114E of the second electrode 114 may extend under the capping element 112 to contact the switching element 110. A height $H_{110E}$ of the exposed region 110E of the switching element 110 adjoining the second electrode 114 may also be greater than or equal to 10 nm, and may range from about 40 nm to about 160 nm in a non-limiting embodiment.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
    a base layer;
    an insulating layer arranged over the base layer, wherein the insulating layer comprises a recess having opposing side walls;
    a first electrode arranged at least partially within the recess of the insulating layer and along the opposing side walls of the recess of the insulating layer;
    a switching element arranged at least partially within the recess of the insulating layer and along the first electrode;
    a capping element arranged at least partially within the recess of the insulating layer; and
    a second electrode arranged at least partially within the recess of the insulating layer, wherein the capping element is arranged between the second electrode and the switching element, and a part of the second electrode extends across the capping element to contact the switching element.

2. The memory device of claim 1, wherein each of the first electrode, the switching element and the capping element is arranged completely within the recess.

3. The memory device of claim 1, wherein the part of the second electrode extends over the capping element to contact the switching element.

4. The memory device of claim 1, wherein a base surface of the capping element, a base surface of the switching element and a base surface of the first electrode are laterally aligned.

5. The memory device of claim 1, wherein the part of the second electrode extends under the capping element to contact the switching element.

6. The memory device of claim 1, wherein a top surface of the capping element, a top surface of the switching element and a top surface of the first electrode are laterally aligned.

7. The memory device of claim 1, wherein a height of the capping element is smaller than a height of the switching element.

8. The memory device of claim 1, wherein the capping element is arranged along a part of the switching element, and wherein the switching element includes a covered region adjoining the capping element and an exposed region adjoining the second electrode.

9. The memory device of claim 8, wherein the second electrode comprises a liner arranged along the exposed region of the switching element and further along the capping element.

10. The memory device of claim 8, wherein a height of the exposed region of the switching element is greater than or equal to 10 nm.

11. The memory device of claim 1, wherein the capping element includes capping material having an etch selectivity of greater than 5 with respect to the switching element.

12. The memory device of claim 1, wherein the opposing side walls of the recess of the insulating layer comprises a first side wall and a second side wall, wherein the capping element comprises a first segment nearer to the first side wall and a second segment nearer to the second side wall, and wherein the first segment and the second segment of the capping element are separated from each other.

13. The memory device of claim 12, wherein each of the first segment and the second segment of the capping element is a continuous segment.

14. The memory device of claim 1, wherein the first electrode is an inert electrode and the second electrode is an active electrode.

15. The memory device of claim 1, wherein the memory device further comprises a conductive layer arranged over and along the second electrode.

16. The memory device of claim 1, wherein the memory device further comprises a first blocking layer arranged between the insulating layer and the base layer, and wherein the second electrode extends into the first blocking layer.

17. The memory device of claim 16, wherein the memory device comprises a further insulating layer arranged above the insulating layer, and a second blocking layer between the insulating layer and the further insulating layer.

18. The memory device of claim 1, wherein the memory device comprises a resistive random access memory device.

19. A method comprising:
    providing a base layer;
    forming an insulating layer over the base layer, wherein the insulating layer comprises a recess having opposing side walls;
    forming a first electrode at least partially within the recess of the insulating layer and along the opposing side walls of the recess of the insulating layer;
    forming a switching element at least partially within the recess of the insulating layer and along the first electrode;
    forming a capping element at least partially within the recess of the insulating layer; and
    forming a second electrode at least partially within the recess of the insulating layer, wherein the capping element is arranged between the second electrode and the switching element, and a part of the second electrode extends across the capping element to contact the switching element.

20. The method of claim 19, wherein forming the capping element comprises:
    depositing capping material into the recess of the insulating layer, wherein the capping material lines the switching element and a bottom surface of the recess; and
    removing a part of the capping material lining the bottom of the recess and a part of the capping material lining the switching element to form the capping element.

* * * * *